United States Patent
Happ

(10) Patent No.: US 7,391,050 B2
(45) Date of Patent: Jun. 24, 2008

(54) PHASE CHANGE MEMORY DEVICE WITH THERMAL INSULATING LAYERS

(75) Inventor: Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 11/187,533

(22) Filed: Jul. 22, 2005

(65) Prior Publication Data

US 2006/0018156 A1 Jan. 26, 2006

(30) Foreign Application Priority Data

Jul. 23, 2004 (DE) .................. 10 2004 035 830

(51) Int. Cl.
*H01L 29/04* (2006.01)

(52) U.S. Cl. ................. 257/52; 257/2; 257/49; 257/E29.08; 257/E31.029; 438/482

(58) Field of Classification Search .......... None
See application file for complete search history.

(56) References Cited

U.S. PATENT DOCUMENTS

| | | | |
|---|---|---|---|
| 5,848,043 A | 12/1998 | Takada et al. | |
| 5,933,365 A | 8/1999 | Klersy et al. | |
| 6,507,061 B1 * | 1/2003 | Hudgens et al. | 257/295 |
| 6,828,884 B2 * | 12/2004 | Wyeth et al. | 333/262 |
| 6,927,411 B2 * | 8/2005 | Kozicki | 257/4 |
| 7,023,014 B2 * | 4/2006 | Morimoto et al. | 257/42 |
| 2003/0071289 A1 | 4/2003 | Hudgens et al. | |
| 2003/0104685 A1 | 6/2003 | Reinberg | |
| 2004/0007718 A1 | 1/2004 | Campbell | |
| 2004/0109351 A1 | 6/2004 | Morimoto et al. | |

FOREIGN PATENT DOCUMENTS

WO 93/02480 2/1993

OTHER PUBLICATIONS

A. Pirovano et al., "Scaling Analysis of Phase-Change Memory Technology", IEEE 2003, pp. 29.6.1-29.6.4.

* cited by examiner

*Primary Examiner*—A. Sefer
*Assistant Examiner*—Scott R Wilson
(74) *Attorney, Agent, or Firm*—Dicke, Billig & Czaja PLLC

(57) ABSTRACT

A memory device is described an active material configured to be placed in a more or less conductive state by means of appropriate switching processes. The active material is positioned between a material having low thermal conductivity or material layers having low thermal conductivity.

25 Claims, 3 Drawing Sheets

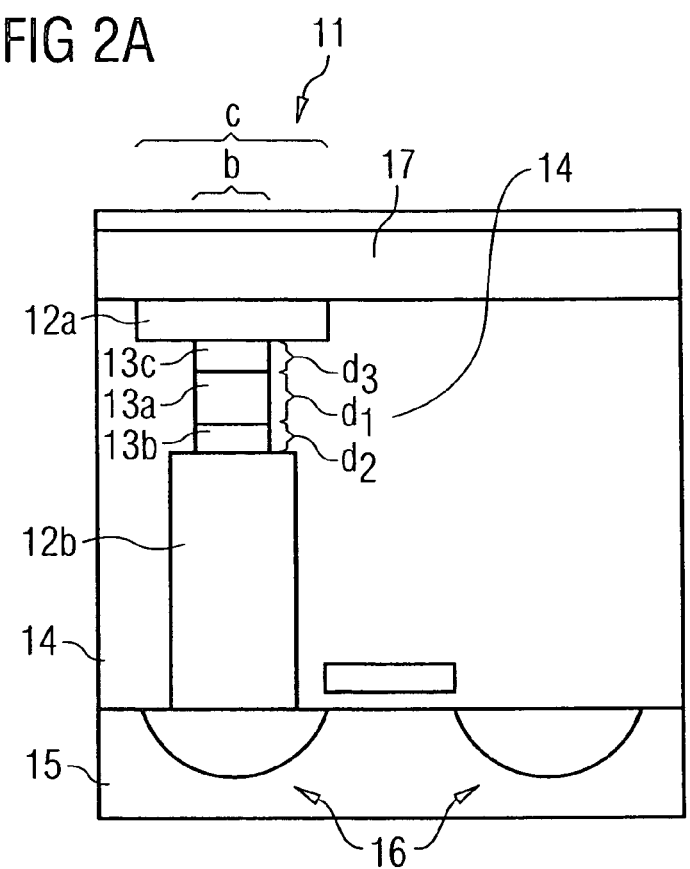
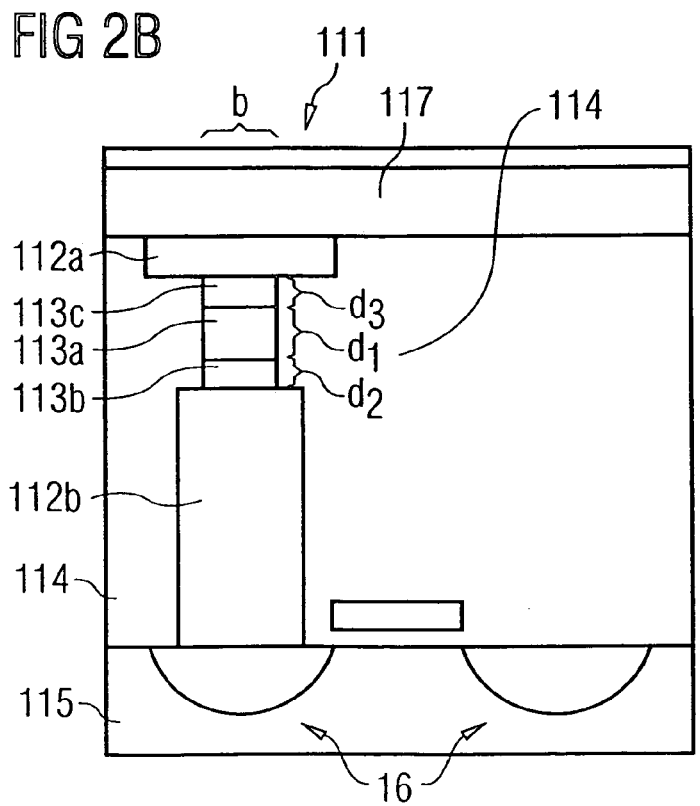

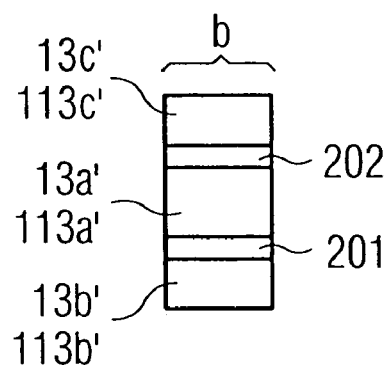
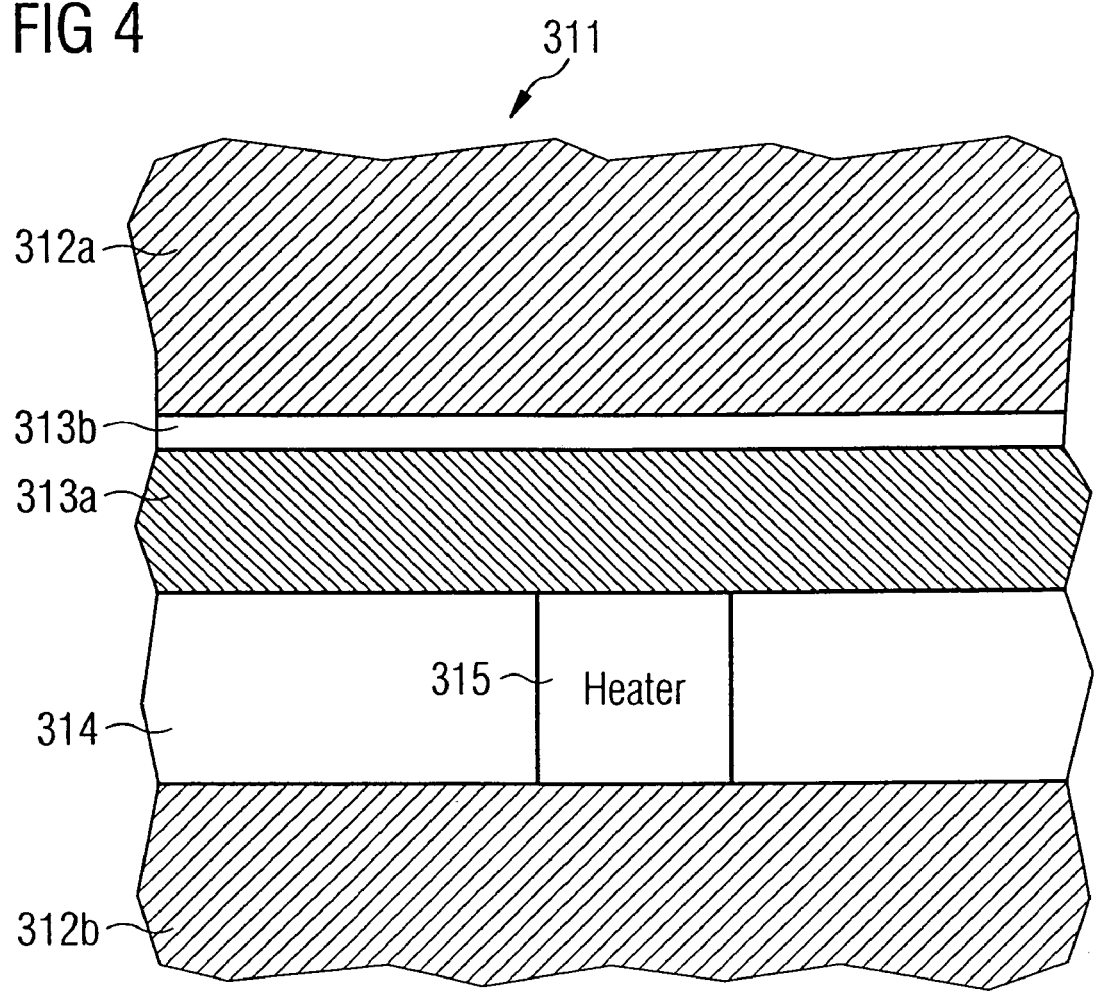

PHASE CHANGE MEMORY DEVICE WITH THERMAL INSULATING LAYERS

CROSS-REFERENCE TO RELATED APPLICATIONS

This Utility Patent Application claims priority to German Patent Application No. DE 10 2004 035 830.3 filed on Jul. 23, 2004, which is incorporated herein by reference.

FIELD OF THE INVENTION

The invention relates to a memory device, in particular a resistively switching memory device.

BACKGROUND

In the case of conventional memory devices, in particular conventional semiconductor memory devices, one differentiates between functional memory devices (e.g., PLAs, PALs, etc.) and table memory devices, e.g., ROM devices (ROM=Read Only Memory)—in particular PROMs, EPROMs, EEPROMs, flash memories, etc.—, and RAM devices (RAM=Random Access Memory or read-write memory), e.g., DRAMs and SRAMs.

A RAM device is a memory for storing data under a pre-determined address and for reading out the data under this address later.

Since it is intended to accommodate as many memory cells as possible in a RAM device, one has been trying to realize same as simple as possible.

In the case of SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitive element (e.g. the gate-source capacitance of a MOSFET) with the capacitance of which one bit each can be stored as charge.

This charge, however, remains for a short time only. Therefore, a so-called "refresh" must be performed regularly, e.g., approximately every 64 ms.

In contrast to that, no "refresh" has to be performed in the case of SRAMs, i.e., the data stored in the memory cell remain stored as long as an appropriate supply voltage is fed to the SRAM.

In the case of non-volatile memory devices (NVMs), e.g., EPROMs, EEPROMs, and flash memories, the stored data remain, however, stored even when the supply voltage is switched off.

Furthermore, so-called resistive or resistively switching memory devices have also become known recently, e.g., so-called Phase Change Memories, etc.

In the case of resistive or resistively switching memory devices, an "active" material—which is, for instance, positioned between two appropriate electrodes (i.e. an anode and a cathode)—is placed, by appropriate switching processes, in a more or less conductive state (wherein e.g., the more conductive state corresponds to a stored, logic "one", and the less conductive state to a stored, logic "zero", or vice versa).

In the case of Phase Change Memories, for instance, an appropriate chalcogenide compound may be used as an "active" material that is positioned between two corresponding electrodes (e.g., a Ge—Sb—Te or an Ag—In—Sb—Te compound).

The chalcogenide compound material is adapted to be placed in an amorphous, i.e., relatively weakly conductive, or a crystalline, i.e., relatively strongly conductive state by appropriate switching processes (wherein, e.g., the relatively strongly conductive state may, for instance, correspond to a stored, logic "One", and the relatively weakly conductive state may correspond to a stored, logic "Zero", or vice versa).

Phase change memory cells are, for instance, known from G. Wicker, Nonvolatile, High Density, High Performance Phase Change Memory, SPIE Conference on Electronics and Structures for MEMS, Vol. 3891, Queensland, 2, 1999, and e.g., from Y. N. Hwang et al., Completely CMOS Compatible Phase Change Nonvolatile RAM Using NMOS Cell Transistors, IEEE Proceedings of the Nonvolatile Semiconductor Memory Workshop, Monterey, 91, 2003, S. Lai et al., OUM-a 180 nm nonvolatile memory cell element technology for stand alone and embedded applications, IEDM 2001, etc.

In order to achieve, with a corresponding memory cell, a change from an amorphous, i.e., a relatively weakly conductive state of the "active" material, to a crystalline, i.e., relatively strongly conductive state, an appropriate heating current pulse can be applied to the electrodes, heating current pulse leading to the "active" material being heated beyond the crystallization temperature and crystallizing ("writing process").

Vice versa, a change of state of the "active" material from a crystalline, i.e., relatively strongly conductive state, to an amorphous, i.e., relatively weak conductive state, may, for instance, be achieved by—again by means of an appropriate heating current pulse—the "active" material being heated beyond the melting temperature and being subsequently "quenched" to an amorphous state by quick cooling ("deleting process").

To achieve a correspondingly quick and strong heating of the active material beyond the crystallization or melting temperature, respectively, relatively high currents may be necessary, which may result in correspondingly high power consumption.

Furthermore, the consequence of high heating currents may be that the corresponding cell can no longer be controlled by an individual transistor with a correspondingly small structure size, which may result in a corresponding—possibly strongly reduced—compactness of the respective memory device comprising a plurality of phase change memory cells and appropriate triggering transistors.

SUMMARY

In one embodiment, the present invention provides a memory device having an active material that is configured to be placed in a more or less conductive state by means of appropriate switching processes. The active material is positioned between material layers having a low thermal conductivity relative to other material layers in the memory device.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2a a schematic, lateral cross-section view illustrating the structure of a resistively switching memory device according to an embodiment of the present invention.

FIG. 2b a schematic, lateral cross-section view illustrating the structure of a resistively switching memory cell according to a further embodiment of the present invention.

FIG. 3 a schematic, lateral cross-section view illustrating an alternative structure of a portion of a resistively switching memory cell.

FIG. 4 a schematic lateral cross-section view illustrating the structure of a resistively switching memory cell according to an additional embodiment of the present invention.

DETAILED DESCRIPTION

Figure 1:
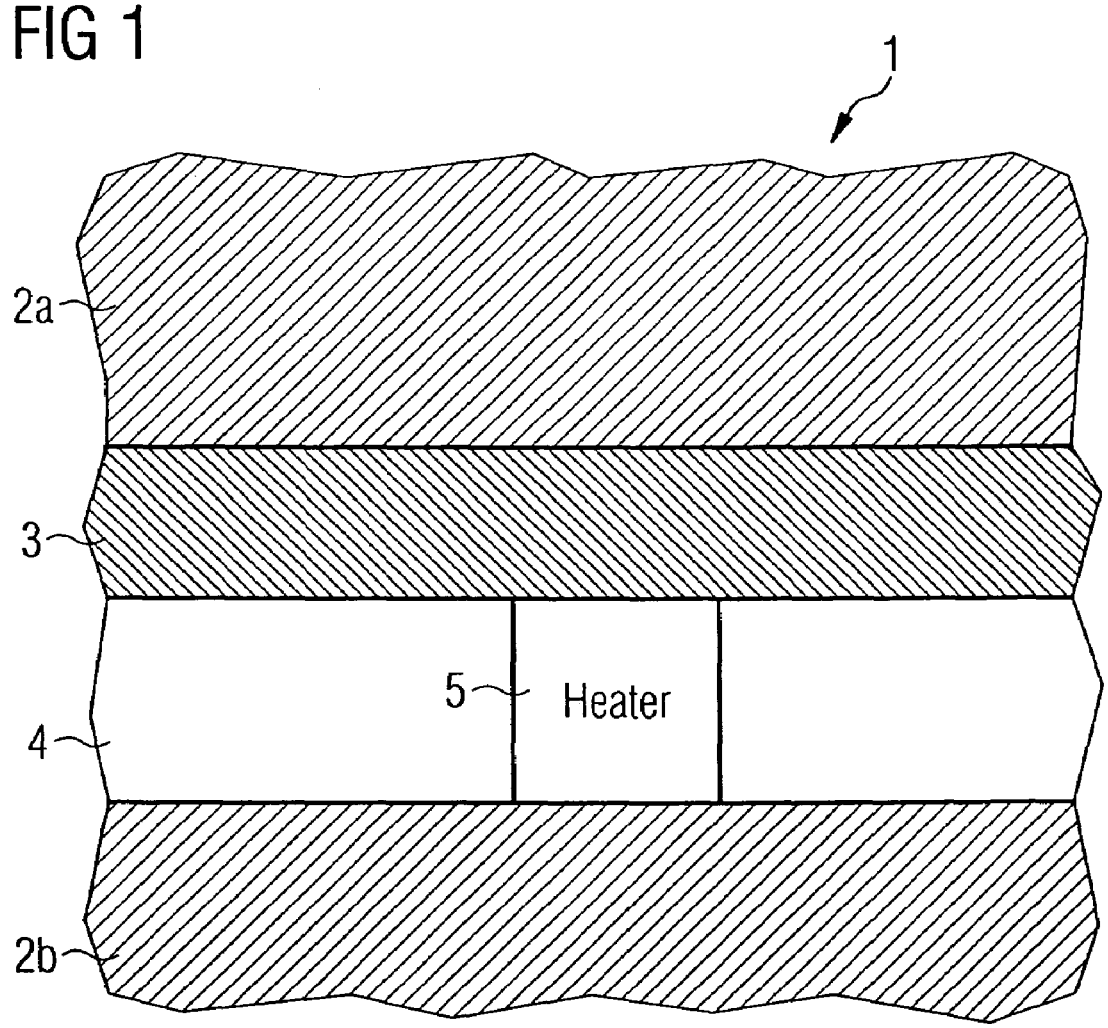
FIG. 1 a schematic, lateral cross-section view of the structure of a resistively switching memory cell according to prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel memory device.

In accordance with one embodiment of the invention, a memory device is provided which comprises an active material that is adapted to be placed in a more or less conductive state by means of appropriate switching processes, wherein the active material is positioned between a material having low thermal conductivity or material layers having low thermal conductivity, respectively. Due to this, it can, for instance, be achieved that, during a heating process during programming (writing or deleting), the active material is thermally insulated.

Thus, the volume heated during the heating process may be kept low (so that, during the above-mentioned heating process, the active material is heated as much as possible, and surrounding regions of the memory device in particular corresponding electrodes are heated as little as possible, this minimizing thermal conduction losses and thus the heating currents required for heating).

FIG. 1 illustrates schematically and for the sake of example the structure of a resistively switching memory cell 1 (here: a phase change memory cell 1) according to prior art.

It comprises two corresponding metal electrodes 2a, 2b (i.e., one anode and one cathode) between which a corresponding, "active" material layer 3 is positioned which can be placed in a more or less conductive state by means of appropriate switching processes (wherein e.g., the more conductive state corresponds to a stored, logic "One" and the less conductive state to a stored, logic "Zero", or vice versa).

With the above-mentioned phase change memory cell 1, e.g., an appropriate chalcogenide compound (e.g., a Ge—Sb—Te or an Ag—In—Sb—Te compound) may be used as an "active" material for the above-mentioned material layer 3.

The chalcogenide compound material may be placed in an amorphous, i.e., relatively weakly conductive, or in a crystalline, i.e., relatively strongly conductive, state by means of appropriate switching processes (wherein e.g., the relatively strongly conductive state may correspond to a stored, logic "One" and the relatively weakly conductive state may correspond to a stored, logic "Zero", or vice versa).

An appropriate heating material layer 5 surrounded by an appropriate insulating layer 4 may, optionally, be provided with the phase change memory cells 1 below the active material layer 3 and above the lower electrode 2b.

In order to achieve, with the memory cell 1, a change from an amorphous, i.e., relatively weakly conductive state of the "active" material, to a crystalline, i.e., relatively strongly conductive state, an appropriate heating current pulse may be applied at the electrodes 2a, 2b, resulting in that the heating material layer 5 and adjacent regions of the active material layer 3 are correspondingly heated beyond the crystallization temperature of the active material, which results in a crystallization of the corresponding regions of the active material layer 3 ("writing process").

Vice versa, a change of state of the corresponding regions of the active material layer 3 from a crystalline, i.e., relatively strongly conductive state, to an amorphous, i.e., relatively weakly conductive state, may, for instance, be achieved in that again by applying an appropriate heating current pulse at the electrodes 2a, 2b and the resulting heating of the heating material layer 5 and of corresponding regions of the active material layer 3 the corresponding regions of the active material layer 3 are heated beyond the melting temperature and are subsequently "quenched" to a crystalline state by quick cooling ("deleting process").

To achieve a correspondingly quick heating of the corresponding regions of the active material layer 3 beyond the crystallization or melting temperature, respectively, relatively high currents may be necessary.

FIG. 2a illustrates a schematic representation of the structure of a resistively switching memory cell 11 according to an embodiment of the present invention.

The memory cell 11 may as will be explained in more detail in the following in particular be e.g., a phase change memory cell 11.

A corresponding "active" material layer 13a is positioned between two appropriate metal electrodes or contacts 12a, 12b (i.e., one anode and one cathode), respectively, and two further additional layers 13b, 13c that will be explained in more detail in the following, the active material layer 13a being adjacent to the additional layers 13b, 13c.

The "active" material layer 13a may be placed in a more or less conductive state by appropriate switching processes or by heating currents caused thereby, respectively, (in particular in an amorphous, i.e., relatively weakly conductive, or a crystalline, i.e., relatively strongly conductive state, wherein e.g., the more conductive state corresponds to a stored, logic "One" and the less conductive state corresponds to a stored, logic "Zero", or vice versa).

An appropriate chalcogenide compound (e.g. a Ge—Sb—Te compound, in particular a Ge2Sb2Te5 compound, for instance GeSbTe:N or GeSbTe:N:O or GeSbTe:O (in particular relatively strongly doped, in particular relatively strongly nitrogen and/or oxygen doped GeSbTe), or a—possibly also correspondingly strongly doped, in particular strongly nitrogen and/or oxygen doped—Ag—In—Sb—Te compound, etc.), or any other suitable phase change material may, for instance, be used as an "active" material for the above-mentioned material layer 13a.

As a material for the upper metal electrode or the upper contact 12a, respectively—contacting the upper additional layer 13c—TiN, TiSiN, TiAlN, TaSiN, or TiW, etc. may, for instance, be used, or e.g. tungsten, or any other, suitable electrode material.

The lower metal electrode or the lower contact 12b, respectively contacting the lower additional layer 13c may, for instance, be made of tungsten (or e.g., of any other, suitable electrode materials, e.g., the electrode materials indicated above for the upper contact 12a).

The contacts 12a, 12b, the additional layers 13b, 13, and the active material layer 13a of the memory cell 11 are laterally surrounded by an appropriate insulating layer 14 that insulates the contacts 12a, 12b, the additional layers 13b, 13c, and the active material layer 13a of the memory cell 11 thermally and/or electrically from corresponding further memory cells positioned next to the memory cell 11 and having a structure that is correspondingly similar or identical thereto.

The insulating layer 14 may, for instance, consist of SiO2 or ZnS:SeO2, or any other suitable, thermally and electrically insulating material.

A substrate layer 15, which may, for instance, be made of silicon, may be positioned below the memory cell 11 (or below the lower contact 12b, respectively, and the insulating layer 14 (directly adjacent to the lower limiting regions of the lower contact 12b and the insulating layer 14 positioned in the same plane)).

In the substrate layer 15, switching or selecting elements 16, in particular FET transistors that control the respective memory cell 11, in particular provide the heating currents necessary for writing and deleting the memory cell 11 are arranged, as well as e.g., corresponding sense amplifiers that read out the data stored in the memory cells 11, etc.

As will be explained in more detail below, relatively low heating currents that are applied to the active material layer 13a via the contacts 12a, 12b may be used with the memory cell 11, in particular heating currents smaller than e.g., 200 µA, or e.g., 130 µA, or e.g., 100 µA, in particular smaller than 80 µA, or 60 µA, etc., so that a corresponding individual memory cell 11 can be controlled by one single switching element 16 assigned to the memory cell 11 and providing the appropriate heating current (and comprising e.g. only one single, or two cooperating, oppositely inverse transistors, or an appropriately switched individual diode) (in particular by one transistor or one diode, respectively, or by transistors with a correspondingly small (minimum) structure size).

In reference to FIG. 2a, an appropriate wiring metallization layer may be provided above the upper contact 12a and the insulating layer 14 (directly adjacent to the upper limiting regions of the upper contact 12a and the insulating layer 14 positioned in the same plane).

In reference to FIG. 2a (together with the above explanations), the memory cell 1 comprises an "active-in-via" geometry.

The active material layer 13a may, for instance, have a thickness d1 of e.g., <160 nm, in particular e.g., <100 nm, preferably <80 nm, <60 nm, or <30 nm (e.g., a thickness d1 of 40 nm).

The two additional layers 13b, 13c each may have a somewhat or a substantially smaller layer thickness d2 or d3, respectively, than the active material layer 13a (e.g., a layer thickness that is, for instance, by more than one third smaller, e.g., a layer thickness d2 or d3, respectively, of e.g., <80 nm, in particular e.g., <50 nm, preferably <40 nm, <30 nm, or <15 nm (e.g., a thickness d2 or d3, respectively, of 20 nm)).

The active material layer 13a and the additional layers 13b, 13c may—viewed from the top have e.g., a substantially round or square (or e.g., rectangular) cross-section.

Furthermore, as is illustrated in FIG. 2a, the material layer 13a and/or the additional layer 13b and/or the additional layer 13c each may have an identical or substantially identical length, and/or an identical and/or substantially identical breadth b (with the length and/or the breadth b being e.g., <160 nm, in particular e.g., <100 nm, preferably <80 nm, <60 nm, or <30 nm (e.g. 40 nm)).

The two contacts 12a, 12b may, in the embodiment illustrated here, each have a somewhat or substantially greater length and/or breadth c than the active material layer 13a and/or the additional layers 13b, 13c (e.g., a length and/or breadth that is by more than one fifth or more than one third larger than the material layer 13a and/or the additional layers 13b, 13c, e.g., a length and/or breadth c of e.g., <200 nm, in particular e.g. <130 nm, preferably <100 nm, <80 nm, or <40 nm (e.g., 50 nm)).

The two additional layers 13b, 13c thermally insulate the active material layer 13a during the heating process during the programming (writing or deleting) of the memory cell 11, and to thus keep the volume heated during the heating process low (so that, during the above-mentioned heating process, the active material layer 13a is heated as much as possible, and surrounding regions of the memory cell 11 in particular the electrodes 12a, 12b are heated as little as possible, so that substantially only the active material layer 13a functions as a "heating area" and the additional layers 13b, 13c function as an "insulating area", so that heating losses are minimized).

Advantageously, the additional layers 13b, 13c consist of a material having a relatively low thermal conductivity or a relatively low thermal conductivity/thermal capacity relation, respectively, e.g., similar to the active material layer of a chalcogenide compound.

Preferably, the material used for the additional layers 13b, 13c has, for instance, approximately the same, or, particularly preferably, a lower, in particular by more than one third or more than a half lower, thermal conductivity (or thermal conductivity/thermal capacity relation, respectively) than the material used for the active material layer 13a (in particular during the above-mentioned state changes of the active material layer 13a during the writing and/or deleting process), and/or than the material used for the contacts 12a, 12b.

Furthermore, the material used for the additional layers 13b, 13c preferably has a higher, in particular by more than one third or a half, e.g., more than twice or three times higher electrical conductivity than the material used for the active material layer 13a (in particular even in its above-mentioned relatively strongly conductive, "written", crystalline state).

Undoped or relatively weakly doped GeTe chalcogenide (which thus has a relatively high electrical conductivity) may, for instance, be used as a material for the additional layers (or, alternatively, e.g., an appropriately undoped or relatively weakly (oxygen and/or nitrogen) doped Ge—Sb—Te compound or Ag—In—Sb—Te compound—which thus has a relatively high electrical conductivity, etc.)

The material used for the additional layers 13b, 13c preferably has a higher, in particular by more than 30° C., or more than 50° C. or 80° C. higher melting point than the material used for the active material layer 13a (for instance, Ge2Sb2Te5 with a melting point of approximately 616° C. may be used as a material for the active material layer 13a, and GeTe with a melting point of approximately 725° C. may be used as a material for the additional layers 13b, 13c).

Thus, it is achieved that the additional layers 13b, 13c are, during the operation of the memory cell 11, continuously kept in a (very) strongly conductive crystalline state existing after the manufacturing of the memory cell 11.

FIG. 2b illustrates a schematic representation of the structure of a resistively switching memory cell 111 according to a further, alternative embodiment of the present invention.

The memory cell 111 comprises corresponding to the memory cell 11 illustrated in FIG. 2a a substrate layer 115, a wiring metallization layer 117, an insulating layer 114, and an "active" material layer 113a positioned between two corresponding metal electrodes or contacts 112a, 112b and two additional layers 113b, 113c.

The memory cell 111 may, corresponding to the memory cell 11 illustrated in FIG. 2a, in particular be e.g., a phase change memory cell 111.

The memory cell 111 illustrated in FIG. 2b is correspondingly identically structured and equipped as (using correspondingly identical materials and (layer) thicknesses, (layer) lengths and (layer) breadths (in particular for the active material layer 113a and the additional layers 113b, 113c)) and works correspondingly identical to the memory cell 11 illustrated in FIG. 2a, except for the length and/or breadth b of one of the contacts 112a, 112b (here: of the upper contact 112a, or alternatively: of the lower, or both contacts 112a, 112b) being as large or substantially as large as the length and/or breadth b of the active material layer 113a and/or the additional layers 113b, 113c (e.g., <160 nm, in particular e.g., <100 nm, preferably <80 nm, <60 nm, or <30 nm (e.g., 40 nm)).

Referring to FIG. 3, instead of the active material layer 13a, 113a that is used in the embodiments according to FIGS. 2a and 2b and is in direct contact with the additional layers 13b, 13c, 113b, 113c, an active material layer 13a', 113a' may, alternatively, also be used (with the memory cells for the rest being identically or substantially identically structured to those illustrated in FIGS. 2a and 2b), the active material layer 13a', 113a' not being in direct contact with additional layers 13b', 13c', 113b', 113c' corresponding to the above-mentioned additional layers 13b, 13c, 113b, 113c.

Instead, according to FIG. 3—using correspondingly identical or similar materials and (layer) thicknesses, (layer) lengths, and (layer) breadths for the active material layer 13a', 113a' and the additional layers 13b', 13c', 113b', 113c' as explained above by means of FIGS. 2a and 2b for the active material layer 13a or 113a, respectively, and the additional layers 13b, 13c, 113b, 113c—a further layer 202 may be provided between the (upper) additional layer 13c', 113c' and the active material layer 13a', 113a', and/or a further layer 201 between the (lower) additional layer 13b', 113b' and the active material layer 13a', 113a'.

The further layers 201, 202 may each have a somewhat or a substantially smaller layer thickness than the active material layer 13a', 113a', and/or the additional layers 13b', 13c', 113b', 113c' (e.g., a layer thickness that is by more than one third or one fifth smaller, e.g., a layer thickness of e.g., <30 nm, in particular <10 nm, or <3 nm (e.g., a thickness of 5 nm).

The further layers 201, 202 may corresponding to the active material layer 13a', 113a' and the additional layers 13b', 13c', 113b', 113c' e.g., have—viewed from the top a substantially round or square (or e.g., rectangular) cross-section viewed from the top.

Furthermore, as is illustrated in FIG. 3, the material layer 13a', 113a' and/or the additional layers 13b', 13c', 113b', 113c', and/or the further layers 201, 202 each may have an identical or substantially identical length and/or an identical and/or substantially identical breadth b (with the length and/or breadth b being e.g., <160 nm, in particular e.g., <100 nm, preferably <80 nm, <60 nm, or <30 nm (e.g. 40 nm)).

The further layers 201, 202 may function as a diffusion blockade between the active material layer 13a', 113a' and the additional layers 13b', 13c', 113b', 113c', so that the long-term cycle steadiness of the corresponding memory cells can be increased.

Advantageously, the materials used for the further layers 201, 202 have a relatively low thermal capacity and a relatively high electrical conductivity (e.g., an electrical conductivity that is by more than one third or a half, in particular e.g., by more than twice or three times higher than the material used for the active material layer 13a', 113a' (in its above-mentioned relatively strongly conductive, crystalline state), and/or e.g., a thermal conductivity that is by more than one third or a half lower than the material used for the active material layer 13a', 113a').

The further layers 201, 202 may e.g., consist of metallic or semi-metallic, high temperature stable materials, e.g., TiN, TiAlN, TiSiN, TaSiN, TaAlN, etc.

Alternatively, e.g., amorphous or diamond-like carbon may also be used, which is relatively slow in reaction vis-à-vis the chalcogenide compounds used in the layers 13a', 113a' or 13b', 13c', 113b', 113c', respectively, and which may depending on the deposition method and the graphitic $sp^2$ share be varied in its electrical conductivity in wide ranges, and which has a substantially lower thermal capacity than comparable solid bodies.

Furthermore, e.g., corresponding (well conductive) C—N alloys and any further materials in particular those fulfilling the above-mentioned criteria may also be used for the further layers 201, 202.

FIG. 4 illustrates a schematic, lateral cross-section view of the structure of a resistively switching memory cell 311 according to an additional embodiment of the present invention.

The memory cell 311 illustrated in FIG. 4 may be correspondingly identically or similarly structured and equipped (using correspondingly identical or similar materials and (layer) thicknesses, (layer) lengths and (layer) breadths (in particular for an active material layer 313a, and an additional layer 313b provided between an upper electrode 312a and the active material layer 313a)) and may work correspondingly identical or similar to the memory cells 11, 111 illustrated in FIGS. 2a, 2b, and 3, except that only one additional layer 313b is provided (between the upper electrode 312a and the active material layer 313a) and additionally similar to the memory cell 1 illustrated in FIG. 1 a heating material layer 315 (between a lower electrode 312b and the active material layer 313a) surrounded by an insulating layer 314. As results from FIG. 4, the heating material layer 315 may have a smaller length and/or breadth than the active material layer 313a and/or the additional layer 313b.

Correspondingly similar in further embodiments not illustrated here with a structure otherwise corresponding to the memory cells 11, 111 illustrated in FIGS. 2a, 2b, and 3, only one single and not two additional layer may be provided (e.g., only one additional layer 13c, 113c (or 13b, 113b) positioned between the respective upper (or alternatively: the respective lower) electrodes 12a, 112a (or 12b, 112b, respectively) and the respective active material layer 13a, 113a, but no additional layer positioned between the respectively other electrode and the respective active material layer 13a, 113a.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device comprising:
an active material that is configured to be placed in a more or less conductive state by switching processes, wherein the active material is positioned proximate to at least one material layer having a low thermal conductivity relative to other material layers in the memory device,
wherein the thermal conductivity of the at least one material layer is at least one third lower than a thermal conductivity of the active material.

2. The memory device of claim 1, wherein said active material is laterally surrounded completely by electrically and/or thermally insulating material.

3. The memory device of claim 1, wherein the active material is positioned so at to be in contact with the at least one material layer.

4. The memory device of claim 1, wherein the at least one material layer comprises at least a first material layer and a second material layer, and wherein the active material is positioned between the first and second material layers.

5. A phase change memory device comprising:
an active material configured to be placed in a more or less conductive state by completely or partially placing the active material in an amorphous state or a crystalline state by application of heating currents having different current levels, wherein the active material is positioned proximate to at least one material layer having a low thermal conductivity relative to other material layers in the memory device,
wherein the at least one material layer having the low thermal conductivity has a high electrical conductivity, and
wherein the electrical conductivity of the one material layer having the low thermal conductivity is higher than the electrical conductivity of the active material.

6. The memory device of claim 5, wherein the active material and/or the at least one material layer having the low thermal conductivity have a breadth (b) that is less than or equal to 160 nm.

7. The memory device of claim 5, wherein the active material and the at least one material layer having the low thermal conductivity have a length that is less than or equal to 160 nm.

8. The memory device of claim 7, wherein the active material and the at least one material layer having the low thermal conductivity have a length that is less than or equal to 100 nm.

9. The memory device of claim 7, wherein the active material and the at least one material layer having the low thermal conductivity have a length that is less than or equal to 60 nm.

10. The memory device of claim 5, wherein the active material has a thickness that is less than or equal to 100 nm.

11. The memory device of claim 5, wherein the at least one material layer having the low thermal conductivity has a thickness that is less than or equal to 80 nm.

12. The memory device of claim 5, wherein the active material is positioned so at to be in contact with the at least one material layer.

13. The memory device of claim 5, wherein the at least one material layer comprises at least a first material layer and a second material layer, and wherein the active material is positioned between the first and second material layers.

14. A memory device comprising:
an active material that is configured to be placed in a more or less conductive state by means of appropriate switching processes, wherein the active material is positioned between material layers having a low thermal conductivity relative to other material layers in the memory device, wherein the thermal conductivity of at least one material layer is at least one third lower than a thermal conductivity of the active material,
wherein the material having a low thermal conductivity is a chalcogenide or a chalcogenide compound,
wherein the active material is a chalcogenide or a chalcogenide compound, and
wherein the active material is strongly doped.

15. The memory device of claim 14, wherein the material having a low thermal conductivity is undoped or only weakly doped, respectively.

16. The memory device of claim 14, wherein the material having a low thermal conductivity is a GeTe chalcogenide or a GeTe chalcogenide compound.

17. The memory device of claim 14, wherein the active material is a GeSbTe chalcogenide or a GeSbTe chalcogenide compound.

18. The memory device of claim 14, wherein the active material is an AgInSbTe chalcogenide or an AgInSbTe chalcogenide compound.

19. A memory device comprising:
an active material that is configured to be placed in a more or less conductive state by means of appropriate switching processes, wherein the active material is positioned between material layers having a low thermal conductivity relative to other material layers in the memory device, wherein a diffusion blocking material is arranged between the active material and the material having a low thermal conductivity.

20. The memory device of claim 19, wherein the diffusion blocking material comprises metallic or semi-metallic materials, including at least one of a group consisting of TiN, TiAlN, TiSiN, TaSiN, or TaAlN.

21. The memory device of claim 19, wherein the diffusion blocking material comprises amorphous or diamond-like carbon.

22. A memory device comprising:
an active material configured to be placed in a more or less conductive state by means of appropriate switching processes, wherein a material layer providing a heat insulating function for the active material and having a low thermal conductivity is provided in the vicinity of the active material; and
means for switching the active material,
wherein the thermal conductivity of the material layer is at least one third lower than a thermal conductivity of the active material.

23. The memory device of claim 22, the memory device additionally comprising a heating material layer that provides a heating function for the active material.

24. The memory device of claim 23, wherein the active material is positioned between the heating material layer and the material layer having the low thermal conductivity.

25. The memory device of claim 22, the memory device not comprising any heating material layer, and wherein the active material is positioned between the material layer having a low thermal conductivity and an electrode.

* * * * *